United States Patent [19]

Reichle

[11] Patent Number: 4,580,293

[45] Date of Patent: Apr. 1, 1986

[54] CIRCUIT ARRANGEMENT FOR DRIVING A CURRENT-CONTROLLED COMPONENT

[75] Inventor: Michael Reichle, Eckenhaid, Fed. Rep. of Germany

[73] Assignee: U.S. Philips Corporation, New York, N.Y.

[21] Appl. No.: 555,844

[22] Filed: Nov. 28, 1983

[30] Foreign Application Priority Data

Nov. 27, 1982 [DE]   Fed. Rep. of Germany ....... 3244056

[51] Int. Cl.$^4$ ............................................. H04B 9/00
[52] U.S. Cl. ...................................... 455/609; 307/270;
  372/38; 455/613; 455/618
[58] Field of Search ............... 455/603, 609, 610, 611,
  455/613, 617, 618; 372/25, 26, 33, 29, 38;
  307/311, 270

[56] References Cited

U.S. PATENT DOCUMENTS

| Re. 29,173 | 4/1977 | Dye et al. | 372/38 |
|---|---|---|---|
| 3,258,596 | 6/1966 | Green | 455/618 |
| 3,953,809 | 4/1976 | Kawamoto et al. | 372/26 |
| 4,213,119 | 7/1980 | Ward et al. | 455/609 |

FOREIGN PATENT DOCUMENTS 2035742  6/1980  United Kingdom ................. 372/38

OTHER PUBLICATIONS

Souilliard—"Pulsed Light Source"—IBM Tech Discl. Bulletin—vol. 19, #2, Jul. 1976, pp. 452, 453.
Fabian—"Pulse Circuits"—New Electronics-vol. 13, #19, Sep. 30, 1980-pp. 80-84.
Dimitrios—"Current Pulse"—EDN/EEG, vol. 16, #13-Jul. 1971, p. 51.
Melcher et al.—"IR Remote Control-Engineering Siemens Components XV, 1980, Jul., No. 3, pp. 131-133.
Elektor Oct. 1977—Infra Red Transmitter—pp. 10-2-2-10-25, vol. 3, No. 10.

Primary Examiner—Joseph A. Orsino, Jr.
Attorney, Agent, or Firm—Thomas A. Briody; William J. Streeter; Leroy Eason

[57] ABSTRACT

In a circuit arrangement for driving a current-controlled component, the current-controlled component, a controllable resistance and a current source are arranged in series. A current branch including a capacitor is arranged in parallel with the series arrangement formed by the controllable resistance and the current-controlled component.

7 Claims, 4 Drawing Figures

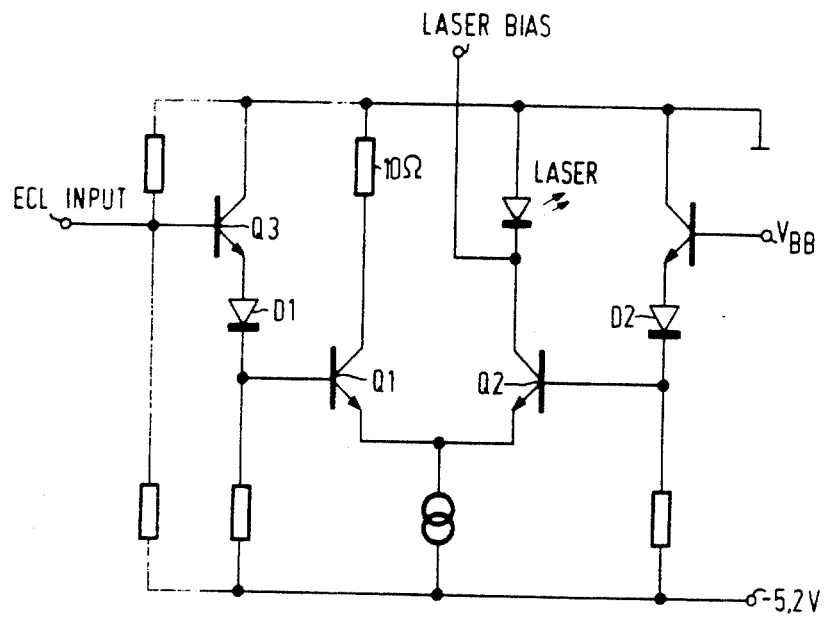
FIG.1
(PRIOR ART)
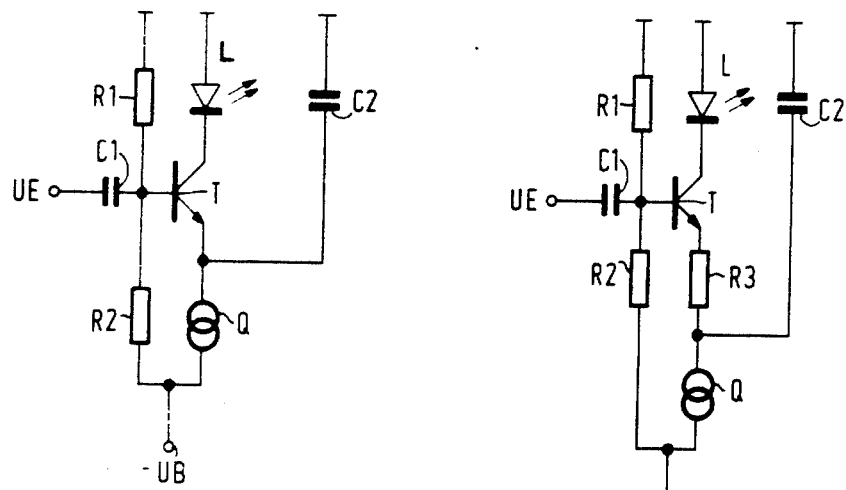
FIG.2
FIG.3

CIRCUIT ARRANGEMENT FOR DRIVING A CURRENT-CONTROLLED COMPONENT

BACKGROUND OF THE INVENTION

The invention relates to a circuit arrangement for driving a current-controlled component.

Current-controlled components are, for example, lasers and light-emitting diodes used as transmitting elements in optical message transmission comprising optical fibers and a transmission medium. Therein, the light intensity of the laser or of the light-emitting diode is modulated by the input signal. In the digital optical message transmission the transmission of light corresponds to, for example, a logic 1, whereas a logic 0 is present when no light is transmitted.

In The Bell Systems, Technical Journal, Vol. 57, No. 6, July-August 1978, a laser transmitter for optical transmission systems is disclosed on pages 1823 to 1833 in the article "GaAlAs Laser Transmitter for Lightwave Transmission Systems" by Shumate, Chen and Dorman. FIG. 2 on page 1826 shows a circuit arrangement for driving a laser, which is here shown in FIG. 1. The input signal is applied via a transfer stage comprising a transistor $Q_3$ to one input of a differential amplifier which comprises two transistors $Q_1$ and $Q_2$. The other input of the differential amplifier is connected to a reference voltage. A resistor having a value of $10\Omega$ is included in the collector lead of the transistor $Q_1$, while the laser is arranged in the collector-lead of the transistor $Q_2$. The emitters of the two transistors $Q_1$ and $Q_2$ are connected to one output of a current source. When the laser is to transmit light, the transistor $Q_2$ is rendered conductive, whereas the transistor $Q_1$ is cut off, so that the current source is connected to the laser via the emitter-collector path of the transistor $Q_2$. If no light is to be transmitted, that is to say there is a pulse pause, the transistor $Q_2$ is cut-off, whereas transistor $Q_1$ is rendered conductive, so that the current source is not operated in the no-load mode, but the current circuit is closed via the emitter-collector path of the transistor $Q_1$ and the 10 $\Omega$-resistor.

This prior art circuit arrangement has the disadvantage that it has a comparatively high power dissipation, as during the pulse pauses the current produced by the current source does not flow through the laser, but through the 106 $\Omega$-resistor, in which ohmic losses occur during periods of current flow through the resistor.

SUMMARY OF THE INVENTION

The invention has for its object to provide a circuit arrangement with reduced power loss for driving a current-controlled component.

The circuit arrangement for driving a current controlled component comprises in series an arrangement of a current controlled component, a controllable resistance and a current source across a DC power source. A current branch including a capacitor is provided in parallel with the series arrangement formed by the controllable resistance and the current controlled component. The current controlled component may be a laser or a light emitting diode. The controllable resistance is a transistor operated as a switch with the emitter/collector terminals being in said series arrangement. The base of the transistor is biased and an input signal is applied to the base of the transistor through a capacitor.

When the transistor is conductive, current flows through the current controlled component, providing an output therefrom, and through the transistor and current source. When the transistor is non-conductive, current from the current source charges the capacitor in the parallel current branch. Then the capacitor discharges through the current controlled component when the transistor is conductive to supplement current flow. No resistance power losses are incurred during operation, whether or not the transistor conducts.

BRIEF DESCRIPTION OF THE DRAWINGS

FIG. 1 is a circuit arrangement of the prior art for driving a laser;

FIG. 2 is a circuit arrangement for driving a current controlled component in accordance with the invention;

FIG. 3 is an alternative embodiment of a circuit arrangement in accordance with the invention.

DESCRIPTION OF THE PREFERRED EMBODIMENTS

Figure 4:
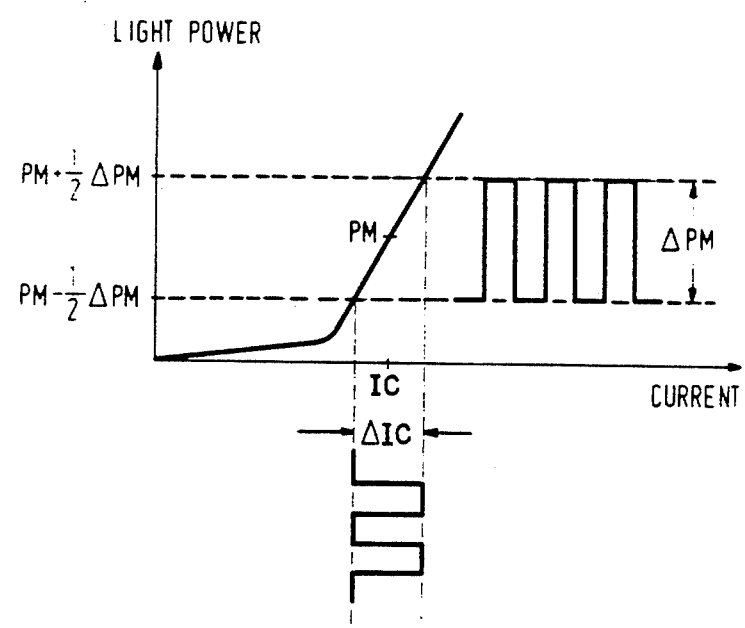
FIG. 4 is a characteristic curve of a laser.

In FIG. 2, an input signal UE is applied via a capacitor C1 to the base of a transistor T, which base is connected to ground via a resistor R1 and to the supply voltage $-UB$ via a resistor R2. The emitter of the transistor T is connected to the supply voltage $-UB$ via a constant current source Q, whereas its collector is connected to ground via a laser or a light-emitting diode L, denoted by LED in the further course of the description. A capacitor C2 connects the emitter of the transistor T to ground.

The resistors R1 and R2 are used to adjust the operating point of the transistor T. The digital input signal UE which is applied to the base of the transistor T via the capacitor C1, (a.c. coupling) modulates the light intensity of the laser or the LED.

During the transmission of a light pulse by the laser or the LED the transistor is rendered conductive, whereas it is cut-off during a pulse pause, so that the current from the current source Q flows as a charging current into the capacitor C2. For a subsequent transmission of a light pulse the transistor becomes conductive again. The current for the laser or the LED are now produced jointly by the current source Q and the charged capacitor C2. In the then subsequent pulse pauses the capacitor C2 is again charged by the current source Q.

During the pulse pauses the current from the current source does not produce ohmic losses in a resistor, but only provides charging of a capacitor and at each pulse subsequent to a pulse pause the current is again applied to the laser or in the LED. Therefore, the current source needs only to produce half of the current it must produce in the prior art circuit arrangement. In other words, when the transistor is operated as a switch only half the power is consumed.

For a current-controlled component having a threshold value, as, for example, in the case of a laser, it may be wise not to cut-off the transistor completely, but to send a bias current through the current-controlled component, as will be further described hereafter with reference to the characteristic curve of a laser which is shown in FIG. 4.

In order to obtain an adequately high light intensity, it is necessary to operate the laser in the steep portion of the curve, that is, after the bend. To that end an average power PM is established as an operating point around which the supplied light power fluctuates. The point PM is established by the quiescent current IC. Half the pulse current ½Δ IC which is proportional to the fluctuations ΔUE of the input voltage UE is now only superimposed on the quiescent current IC. During a pulse pause in the input signal the capacitor $C_2$ takes up half the pulse current ½Δ IC, which is applies again to the laser during the subsequent pulse. At the moments at which the collector current through the transistor and also through the laser consequently assumes the values IC+½Δ IC and IC−½ΔIC, then the laser transmits light having the intensities PM+½Δ PM and PM−½Δ PM. Then the current IC+½Δ IC and the light intensity PM+½Δ PM correspond to a pulse, whereas the current IC−½ΔIC and the light intensity PM−½ΔPM represent a pulse pause. The pulse current ΔIC depends on the quiescent current IC in accordance with the following formula:

$$\Delta IC + \frac{IC}{UT} \cdot \Delta UE$$

where UT is the thermovoltage of the transistor.

The dependence of the pulse current ΔIC on the quiescent current IC can be reduced by means of negative feedback.

The embodiment shown in FIG. 3 differs topologically from the embodiment shown in FIG. 2 only by a negative feedback resistor R3 arranged between the current source Q and the emitter of the transistor T. The capacitor C2 is arranged in parallel with the series arrangement formed by the laser L, the collector-emitter path of transistor T and the negative feedback resistor R3. In this case, the pulse current ΔIC depends on the quiescent current IC in accordance with the following formula:

$$\Delta IC = \frac{1}{\frac{UT}{IC} + R3} \cdot \Delta UE$$

The dependence of the pulse current ΔIC on the quiescent current IC is consequently reduced by the factor $$\frac{1}{1 + \frac{R3 \cdot UT}{IC}}.$$

I claim:

1. A circuit arrangement for driving a current-controlled light-emitting element to emit pulses of light in intervals corresponding to input signal pulses, comprising:
    a direct current power source;
    a transistor having an emitter, base and collector and a main current path between the emitter and collector, the resistance of such main current path being controllable from a relatively high to a relatively low value by a signal applied to the base of the transistor;
    a constant current source arranged in series with said light-emitting element and the main current path of the transistor, such series arrangement being connected to said direct current power source;
    a capacitor in parallel with the series combination of said light-emitting element and the main current path of said transistor;
    and means for coupling input signal pulses to the base of said transistor to control the resistance of the main current path thereof, such resistance decreasing from its high to its low value during each such pulse;
    whereby during each input signal pulse said current source and said capacitor supply current to said light-emitting element, causing it to emit a pulse of light, and during each interval between signal pulses said current source supplies charging current to said capacitor.

2. A circuit arrangement as claimed in claim 1, wherein the current-controlled element is one of a laser and a light-emitting diode.

3. A circuit arrangement as claimed in claim 1, and further comprising means for providing a DC reference bias on the base of said transistor.

4. A circuit arrangement as claimed in claim 1, wherein the current source and the capacitor are connected to the emitter of the transistor and the light-emitting element is connected to the collector of the transistor.

5. A circuit arrangement as claimed in claim 4, wherein said light-emitting element is one of a laser and a light-emitting diode.

6. A circuit arrangement as claimed in claim 4, further comprising a negative feedback resistor connected between the emitter of the transistor and said current source; said capacitor being in parallel with the series combination formed by said light-emitting element, the main current path of the transistor and said negative feedback resistor.

7. A circuit arrangement as claimed in claim 6, wherein the current-controlled element is one of a laser and a light-emitting diode.

* * * * *